United States Patent [19]

Nakano

[11] 4,403,309
[45] Sep. 6, 1983

[54] AUTOMATIC BACK-UP CIRCUIT
[75] Inventor: Masao Nakano, Tokyo, Japan
[73] Assignee: General Research of Electronics, Inc., Tokyo, Japan
[21] Appl. No.: 268,658
[22] Filed: Jun. 1, 1981
[51] Int. Cl.³ .......................................... G11C 11/40
[52] U.S. Cl. .................................... 365/229; 365/228
[58] Field of Search ............... 365/226, 227, 229, 228; 371/10, 14, 66

[56] References Cited
U.S. PATENT DOCUMENTS
3,980,935  9/1976  Worst .................................. 365/229
4,051,945  10/1977  Fujimoto et al. .................... 365/229
4,315,162  2/1982  Ferguson ............................ 365/229

Primary Examiner—Terrell W. Fears
Attorney, Agent, or Firm—Trexler, Bushnell & Wolters, Ltd.

[57] ABSTRACT

An automatic back-up circuitry for use with a memory circuit or the like including a switch transistor adapted to turn on in response to the application of an operative current and conduct it to the memory circuit, said transistor being also adapted to turn off when the application of the main operative current to said transistor is release, whereupon the back-up voltage is applied to the path between the transistor and the memory circuit.

6 Claims, 1 Drawing Figure

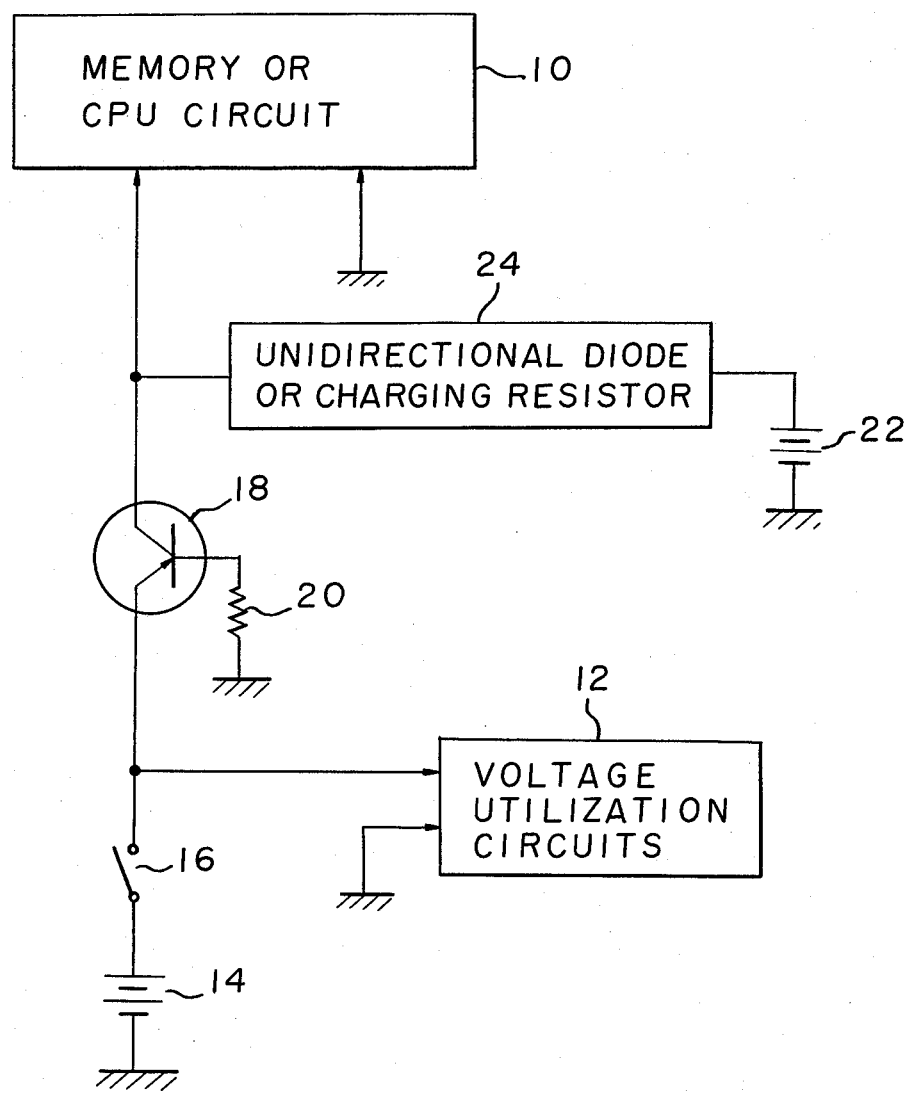

AUTOMATIC BACK-UP CIRCUIT

BACKGROUND AND SUMMARY OF THE INVENTION

This invention relates to a transistor switch circuit. More particularly, it relates to an automatic back-up circuit for memory or CPU circuits using the transistor switch circuit.

The memory circuit or CPU circuit usually needs to be driven by the back-up current for holding memory contents therein after an operating power supply for the main circuitry including such memory circuit was made off. In general, a back-up power supply in the form of a battery is prepared so that it can supply the back-up current at the same time of the switching off of the main circuitry power supply. Furthermore, a diode is connected so as to stop the drawing of the back-up current into the other circuits of the main circuitry. This diode conducts the operating current from the main power supply to the memory IC.

In such prior art back-up circuit arrangement, such unidirectional diode provides considerable voltage drop (it is about 0.6 V with a silicon diode and 0.25 V with a germanium diode). Therefor, with respect to the power supply voltage, it needs to pre-consider a voltage corresponding to this voltage drop. Also, from the viewpoint of low power consumption, such circuit using the diode is not favorable.

Accordingly, the object of the invention is to provide a transistor switch circuit for use with the automatic back-up circuit wherein in place of the unidirectional diode a switching mode transistor is effectively used so that the voltage drop across the transistor becomes very low (under 0.1 V).

The other objects and advantages of the invention will be apparent from the description relating to the illustrated embodiment of the invention.

BRIEF DESCRIPTION OF THE DRAWING

The single FIGURE shows a circuit diagram of an embodiment of the invention.

DESCRIPTION OF THE PREFERRED EMBODIMENT

In the drawing, a memory or CPU circuit 10 and voltage utilization circuits 12, which may constitute a kind of electronic apparatus, are driven or operated by a main power supply 14 when a power ON-OFF switch 16 is closed. At that time, the memory or CPU circuit receives operating current from the main power supply 14 through the closed switch 16 and a transistor 18. The illustrated PNP transistor 18 has its base connected to one terminal of (a) biasing resistor 20 of which other terminal is grounded. When the switch 16 is closed and the emitter of the transistor 18 is coupled to the power supply 14, the current through the resistor 20 provides the base bias voltage of the transistor 18 whereby it is driven to its saturated condition.

When the switch 16 is opened, the transistor 18 turns off since the base bias voltage across the resistor 20 is removed. At the same time, back-up current from a back-up power supply 22 is applied to the memory circuit 10 through a unidirectional diode 24. This diode has its anode connected to the positive pole of the cell 22 and its cathode connected to the junction of the collector of the transistor 18 and the power input terminal of the circuit 10. In the embodiment, the voltage level of the main power supply 14 is 5 V, and that of the back-up battery 22 is 3.6 V. Therefore, when the main power supply 14 provides the operative current to the memory 10, the diode 24 inhibits any current flow from the battery 22. The back-up current from the battery 22 acts to hold the memory contents of the circuit after the main power supply 14 has made ineffective by the opening of the switch 16. Since the transistor switch 18 turns off, the back-up current does not flow into the other circuits 12. The diode 24 may be replaced with a charging resistor which acts to charge the battery 22 with the main operative current from the main power supply 14.

In accordance with this invention, the switching transistor 18 is effectively used in the automatic back-up circuit. The voltage drop across this transistor is very small in comparison with that of the diode. The value thereof is under 0.1 V.

I claim:

1. An automatic back-up circuit for use with a main power supply for a memory circuit or the like comprising: a switching mode transistor connected between said main power supply and said memory circuit, means biasing said transistor to turn on when said transistor receives an operative current from said main power supply and means coupled to the path between said transistor and said memory circuit for connecting a back-up voltage to said memory circuit in response to turning off of said transistor.

2. An automatic back-up circuitry as claimed in claim 1 wherein said biasing means comprises a biasing resistor coupled to the base of said switching mode transistor and providing a base bias for saturating said transistor when said transistor receives the operative current from said main power supply.

3. An automatic back-up circuit for use in an electronic device including a main power supply, utilization circuits, at least one memory circuit, and a power on-off switch coupled intermediate said main power supply and both said utilization circuits and said at least one memory circuit, said automatic back-up circuit comprising: a back-up power supply coupled in circuit with said at least one memory circuit, a switching mode transistor coupled intermediate said at least one memory circuit and both said on/off switch and said back-up power supply; and biasing means coupled to said switching mode transistor; said biasing means being responsive to closing of said on-off switch for biasing said switching mode transistor into saturation to couple said main power supply to said at least one memory circuit and further responsive to opening of said on-off switch for turning off said switching mode transistor to thereby disconnect said main power supply from said memory circuit.

4. An automatic back-up circuit according to claim 3 and further including unidirectional current conducting means coupled intermediate said back-up power supply and both said switching mode transistor and said at least one memory circuit, said unidirectional current conducting means being responsive to said turning off of said transistor for coupling said back-up supply to said memory circuit.

5. An automatic back-up circuit in accordance with claim 3 wherein said switching mode transistor comprises a collector-emitter junction coupled in series intermediate said on-off switch and said at least one memory circuit, and a base electrode; and wherein said biasing means comprises a biasing resistor coupled to said base electrode for biasing said switching mode transistor into saturation in response to closing of said on-off switch.

6. An automatic back-up circuit in accordance with claim 5 wherein said switching mode transistor comprises a PNP transistor having a collector electrode coupled with said at least one memory circuit and an emitter electrode coupled with said on-off switch.

* * * * *